United States Patent
Sandhu

(10) Patent No.: US 10,147,607 B1
(45) Date of Patent: Dec. 4, 2018

(54) SEMICONDUCTOR PITCH PATTERNING

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/685,871

(22) Filed: Aug. 24, 2017

(51) Int. Cl.
| | |
|---|---|
| *H01L 21/033* | (2006.01) |
| *H01L 21/02* | (2006.01) |
| *H01L 21/311* | (2006.01) |
| *H01L 21/308* | (2006.01) |

(52) U.S. Cl.
CPC .... *H01L 21/0337* (2013.01); *H01L 21/02266* (2013.01); *H01L 21/0332* (2013.01); *H01L 21/3081* (2013.01); *H01L 21/3086* (2013.01); *H01L 21/31111* (2013.01); *H01L 21/31116* (2013.01)

(58) Field of Classification Search
CPC ............. H01L 21/0337; H01L 21/0332; H01L 21/02266; H01L 21/3081; H01L 21/31111; H01L 21/3086; H01L 21/31116
See application file for complete search history.

(56) References Cited

U.S. PATENT DOCUMENTS

| | | | |
|---|---|---|---|
| 8,222,140 B2 | 7/2012 | Tang | |
| 8,434,033 B2 | 4/2013 | Ghaida et al. | |
| 8,629,064 B2 | 1/2014 | Li et al. | |
| 9,490,182 B2 | 11/2016 | Shchegrov et al. | |
| 2008/0076070 A1* | 3/2008 | Koh | H01L 21/0273 430/311 |
| 2011/0151668 A1 | 6/2011 | Tang et al. | |
| 2016/0365425 A1* | 12/2016 | Chen | H01L 29/6653 |

* cited by examiner

*Primary Examiner* — Duy Vu N Deo
(74) *Attorney, Agent, or Firm* — Brooks, Cameron & Huebsch, PLLC

(57) ABSTRACT

A semiconductor pitch patterning can include a method comprising directionally forming a mask material on a first set of spacers. The first set of spacers can be formed on a substrate. The method can include directionally forming a mask material on a surface of the substrate. The method can include selectively forming a second set of spacers on side surfaces of the first set of spacers and a portion of the surface of the substrate. The top portion of each of the second set of spacers remains unetched subsequent to removing portions of the mask material from the top portions of the first set of spacers.

10 Claims, 8 Drawing Sheets

303

| | |
|---|---|
| DIRECTIONALLY FORMING A MASK MATERIAL ON A FIRST SET OF SPACERS FORMED ON A SUBSTRATE AND ON A SURFACE OF THE SUBSTRATE | 340 |
| SELECTIVELY FORMING A SECOND SET OF SPACERS ON SIDE SURFACES OF THE FIRST SET OF SPACERS AND A PORTION OF THE SURFACE OF THE SUBSTRATE | 342 |
| WHEREIN A TOP PORTION OF EACH OF THE SECOND SET OF SPACERS REMAINS UNETCHED SUBSEQUENT TO REMOVING PORTIONS OF THE MASK MATERIAL FROM THE TOP PORTIONS OF THE FIRST SET OF SPACERS | 344 |

US 10,147,607 B1

SEMICONDUCTOR PITCH PATTERNING

TECHNICAL FIELD

The present disclosure relates generally to semiconductor devices and methods, and more particularly to semiconductor pitch patterning.

BACKGROUND

A semiconductor device can include integrated circuits with particular feature sizes. The feature sizes can be reduced in order to increase portability, computing power, memory capacity and/or energy efficiency. Reduced feature sizes for integrated circuits can be related to techniques used to form the features. For example, lithography can be used to pattern features (e.g., conductive lines) of integrated circuits. The periodicity of these patterned features can be described as pitch.

Pitch can be described as a distance between points of two neighboring features. Lithographic techniques may not reliably form features below a minimum pitch due to factors such as optics and/or light or radiation wavelength. Thus, the minimum pitch of a lithographic feature can be an obstacle to feature size reduction. As an example, when a pitch is halved, this reduction can be referred to as pitch doubling, and when pitch is quartered, this reduction can be referred to as pitch quadrupling or pitch quad.

Previous approaches to pitch doubling and/or pitch quadrupling can include transferring (e.g., etching) a particular pattern (e.g., a pattern of spacers) onto a number of hard mask layers (sometimes consisting of carbon) a number of times (once for a pitch doubling or repeated more than once for pitch quadrupling). These previous approaches can be costly to etch multiple patterns into multiple hard mask layers. In addition, forming non-square spacers (e.g., spacers having rounded corners) can reduce the quality of patterns transferred to underlying materials, which can lead to various negative effects.

DETAILED DESCRIPTION

Figure 1A:
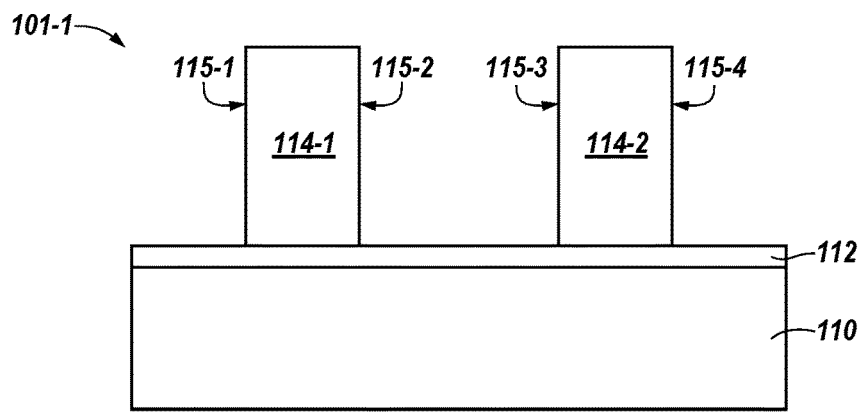
FIGS. 1A-1C is an example of a diagram of semiconductor pitch patterning.

An example semiconductor pitch patterning method can include directionally forming a mask material on a first set of spacers. The first set of spacers can be formed on a substrate. The method can include directionally forming a mask material on a surface of the substrate. The method can include selectively forming a second set of spacers on side surfaces of the first set of spacers and a portion of the surface of the substrate. The top portion of each of the second set of spacers remains unetched subsequent to removing portions of the mask material from the top portions of the first set of spacers.

Various previous pitch doubling and/or pitch quadrupling processes can involve transferring spacer patterns into hard mask layers, which can be used to form at least portions of various semiconductor devices (e.g., transistors, capacitors, digit lines, etc.). Accordingly, the shape of the spacer patterns can be important since their shape will affect the profile of the transferred pattern. For example, in a number of previous approaches, a first set of spacers can be etched into a first hard mask layer and a second set of spacers formed from the first set of spacers can be etched into a second hard mask layer. However, this formation technique can involve etches that result in rounded top portions of the spacers, and such rounded features can be magnified in subsequently formed spacers, which can result in an unacceptable transfer pattern.

In spacer patterning, a spacer material layer) can be formed on a sidewall of a pre-patterned feature (e.g., a photoresist pattern). A spacer can be formed by deposition or reaction of the film on the previous pattern, followed by removing (e.g., etching) the film material on the horizontal surfaces. This leaves the material on the sidewalls. By removing the original patterned feature, only the spacer is left. As there are two spacers for every line (or pre-patterned feature), the line density can be doubled as subsequent spacers are formed on the lines.

By avoiding using hard mask layers, a reduction in cost and time can be achieved. Hard mask layers can be avoided by selectively and directionally forming (e.g., depositing) materials to create spacers at a particular pitch rather than etching into subsequent hard mask layers. This directional and selective deposition can create spacers, and ultimately pitch features, that have horizontally flat top portions that do not magnify anomalies such as rounded top portions during each successive spacer creation, as in previous approaches. A mask material can be applied to a first set of spacers using directional deposition in order to cover a top portion of the first set of spacers and prevent a subsequent second set of spacers from having a rounded top portion.

The subsequent second set of spacers can be selectively formed (e.g., deposited) on those portions of the first set of spacers that are not covered by the mask material. This can include not forming the second set of spacers on the top portions of the first set of spacers as those top portions would be covered by the mask material. In this way, the second set of spacers are not formed (e.g., deposited) over the top portions of the first set of spacers, thereby avoiding creating a rounded (e.g., non-square) top portion which can result from dry etching of the spacer material, for example. Once the first set of spacers are removed (e.g., etched), the second set of spacers will remain with top portions that are horizontally flat with respect to the substrate the second set of spacers are positioned on top of. Further, the top portions of the second set of spacers are not etched subsequent to removal of the first set of spacers. These second set of spacers can be created without using a hard mask layer as the second set of spacers are selectively deposited and the first set of spacers are selectively removed.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. The figures herein follow a numbering convention in which the first digit or digits correspond to the drawing figure number and the remaining digits identify an element or component in the drawing. As used herein, "a number of" a particular element and/or feature can refer to one or more of such elements and/or features.

The terms "first" and "second" may be used herein, and/or in the claims, merely for convenience in differentiating the nomenclature of various features from one another. The use of such terms does not necessarily imply that the materials are of different composition, but sometimes are used to distinguish between materials formed at different elevations, at different times, or in different manners, even if of the same composition. The use of such terms does not intend to convey a particular ordering of the features, including, but not limited to, an order of forming.

Figure 1B:
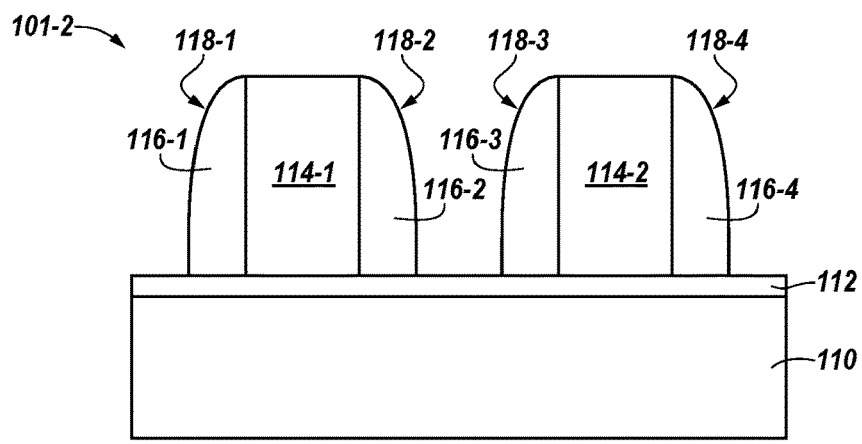
Figure 1C:
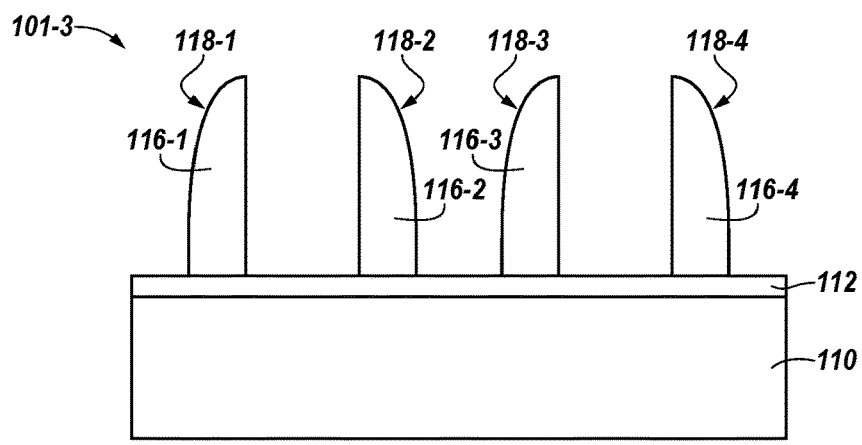

FIGS. 1A-1C are each an example of a diagram 101-1 through 101-3 of semiconductor pitch patterning according to previous approaches. In accordance with the previous approaches, FIGS. 1A-1C each illustrate a substrate 110, a mask layer 112, and patterned lines 114-1, 114-2 (which can be referred to collectively as a set of patterned lines 114). The patterned lines can be used to designate pitch distance and/or features of the substrate. The mask layer 112 can be a carbon mask layer and the substrate 110 can be silicon. While this example, explaining a previous approach, describes a set of patterned lines 114-1, 114-2 that designates a pitch distance in FIGS. 1A-1C, examples are not so limited.

As shown in diagram 101-2 of FIG. 1B, a set of spacers 116-1, 116-2, 116-3, 116-4 (referred to collectively as set of spacers 116). can be formed on side surfaces 115-1, 115-2, 115-3, 115-3 (collectively referred to as side surfaces 115) of the patterned lines 114. For example, spacers 116-1 and 116-2 can be on side surfaces 115-1 and 115-2, respectively, of patterned line 114-1 and spacers 116-3 and 116-4 can be on side surfaces 115-3 and 115-4, respectively, of patterned line 114-2. The set of spacers 116 can be rounded at each top surface 118-1, 118-2, 118-3, 118-4 (collectively referred to as top surfaces 118) of the second set of spacers 116-1, as illustrated in FIG. 1B. For example, the top surfaces 118 of the set of spacers 116 are not horizontally flat with respect to or parallel in relation to the substrate 110. The rounding of spacers 116 can result from an etch process (e.g., dry etch) used to remove excess spacer material of set of spacers 116 (e.g., from the tops of spacers 114 and/or from the surface of the material 112).

The diagram 101-3 of FIG. 1C illustrates removal of the patterned lines 114, resulting in a pitch distance designated by the set of spacers 116. The patterned lines 114 can be removed using a number of etching and/or removal processes. The patterned lines 114 can be removed using a photo-resist removal process. The set of spacers 116 can be transferred to the hard mask layer 112. In an alternative example, instead of patterned lines (such as patterned lines 114-1), a first set of spacers can be used and a second set of spacers (such as set of spacers 116) can be formed on the sides of the first set of spacers.

As the top surfaces 118 of the set of spacers 116 are rounded, forming an additional third set of spacers alongside the set of spacers 116 would create an even more rounded, and therefore warped, top portion. Therefore, transferring the third set of spacers could not be performed without using multiple hard mask layers to transfer each set of spacers to the next hard mask layer, thereby using additional cost and time to perform. By using a directional deposition of a mask material layer and a selective deposition of a subsequent set of spacers, a rounded top portion of the spacers can be avoided, as described further below in association with FIGS. 2A-2H.

Figure 2A:
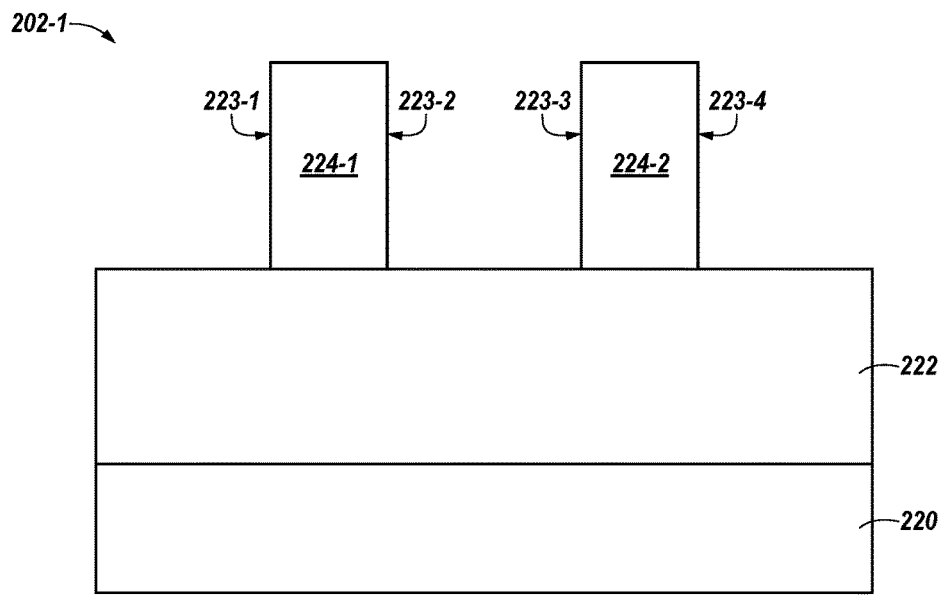
FIGS. 2A-2H is an example of a diagram of semiconductor pitch patterning in accordance with a number of embodiments of the present disclosure.

FIG. 2A is an example of a diagram 202-1 of semiconductor pitch patterning in accordance with a number of embodiments of the present disclosure. The diagram 202-1 illustrates a base substrate 220 and a substrate 222 that a pattern with a particular pitch dimension can be formed onto. As illustrated in FIG. 2A, the semiconductor pitch patterning can include forming a first set of lines (e.g., photo resist pattern lines) 224-1, 224-2 on the substrate 222. Line 224-1 can include side surfaces 223-1, 223-2 and line 224-2 can include side surfaces 223-3, 223-4 (hereinafter 223-1, 223-2, 223-3, and 223-4 are referred to as side surfaces 223).

The substrate 222 can include a single material, a plurality of layers of different materials, a layer or layers having regions of different materials or structures therein, etc. The materials may include semiconductors, insulators, conductors, or combinations thereof. As an example, the substrate may contain gallium nitride, doped polysilicon, an electrical device area, or a metal layer (e.g., a tungsten, tungsten silicide, titanium nitride, aluminum, copper, carbon or combinations thereof) insulator layers (e.g., boron nitride, $SiO_2$, SiN, SiON, or combinations thereof).

Figure 2B:
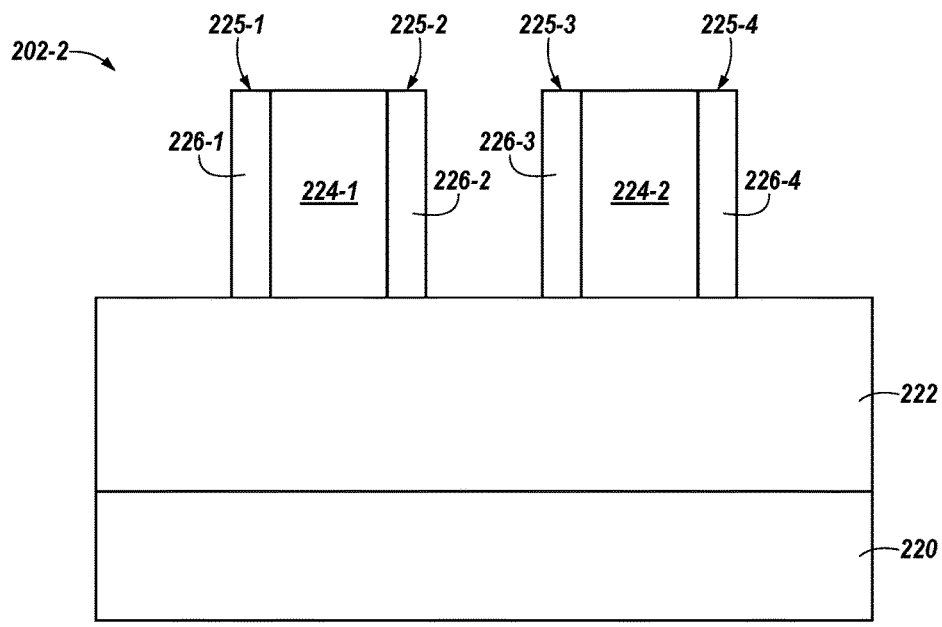

FIG. 2B is an example of a diagram 202-2 of semiconductor pitch patterning in accordance with a number of embodiments of the present disclosure. Diagram 202-2 can indicate a subsequent step from the diagram 202-1 illustrated in FIG. 2A. A set of spacers (e.g., a first set of spacers) 226-1, 226-2, 226-3, 226-4, hereinafter referred to as set of spacers 226, can be applied to respective side surfaces 223 of the lines 224-1, 224-2. In at least one example, the first set of spacers 226 can be comprised of a SiOx (silicon oxide) composition. Further, the set of spacers 226 can be formed as a layer and be comprised of a low temperature, conformal thin film deposition (e.g., silicon dioxide, silicon nitride, silicon, metal (titanium, tantalum, tungsten, etc.), metal nitride, silicon carbide, silicon oxynitride). The spacers 226 can each include a corresponding top surface 225-1, 225-2, 225-3, 225-4, hereinafter referred to as top surfaces 225, corresponding to each of the spacers 226-1, 226-2, 226-3, 226-4.

The spacer layer can be formed (e.g., deposited) using a number of methods, such as: chemical vapor deposition using $O_3$ and TEOS to form silicon oxide, atomic layer deposition using a silicon precursor with an oxygen or nitrogen precursor to form silicon oxides and nitrides. The set of spacers 226 can be formed using a method such as a reactive ion etch (ME) process selectively stopping at a dielectric anti-reflective coating (DARC) layer (not shown). In at least one example, a top surface of the spacers may be sculpted into a square shape using a dry etch process for directional etch. Other methods can include a spin-on deposition and chemical mechanical polishing (CMP) followed by removal of the spin-on material. As an example, the set of spacers 226 can comprise a lateral dimension of ¼ of the dimension of the lines 224-1, 224-2 of the photo resist pattern. As a further example, if the lateral dimensions of the lines 224-1, 224-2 are 4F, the lateral dimension of the set of spacers 226 can be 1F.

The diagram 202-2 illustrates a doubling of the spacers in that two lines, e.g., lines 224-1, 224-2, are formed into four spacers, e.g., spacers 226-1, 226-2, 226-3, 226-4. This can also be referred to as "pitch doubling" in that a pitch of the lines can be doubled by adding twice as many spacers (e.g., two lines used to form four spacers).

Figure 2C:
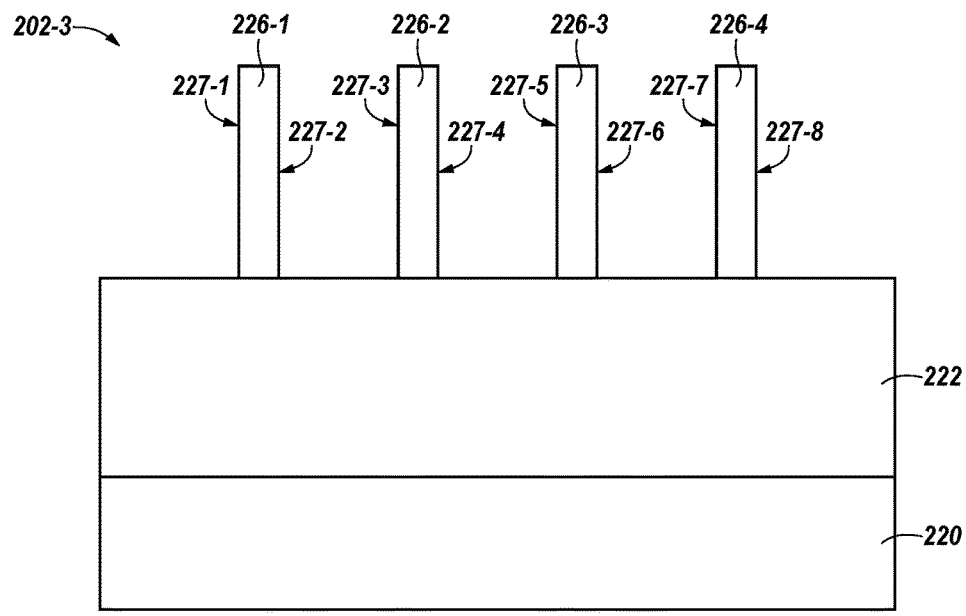

FIG. 2C is an example of a diagram 202-3 of semiconductor pitch patterning in accordance with a number of embodiments of the present disclosure. The diagram 202-3 includes a base substrate 220, a substrate 222, and a set of spacers 226 (e.g., 226-1, 226-2, 226-3, 226-4). The set of spacers 226, that are illustrated and whose patterning is described in FIG. 2B, are exposed by removing lines (e.g., lines 224-1, 224-2) that were between each of the set of spacers 226. As an example, the lines can be selectively removed via an O2 or forming gas plasma process to expose the set of spacers 226. As another example, the lines can be removed via a wet etch process. While FIGS. 2A-2C describes forming the set of spacers 226 using a particular method, examples are not so limited. As an example, the set of spacers 226 can be formed in a similar manner described in association with FIGS. 2D-2G, described further below.

Figure 2D:
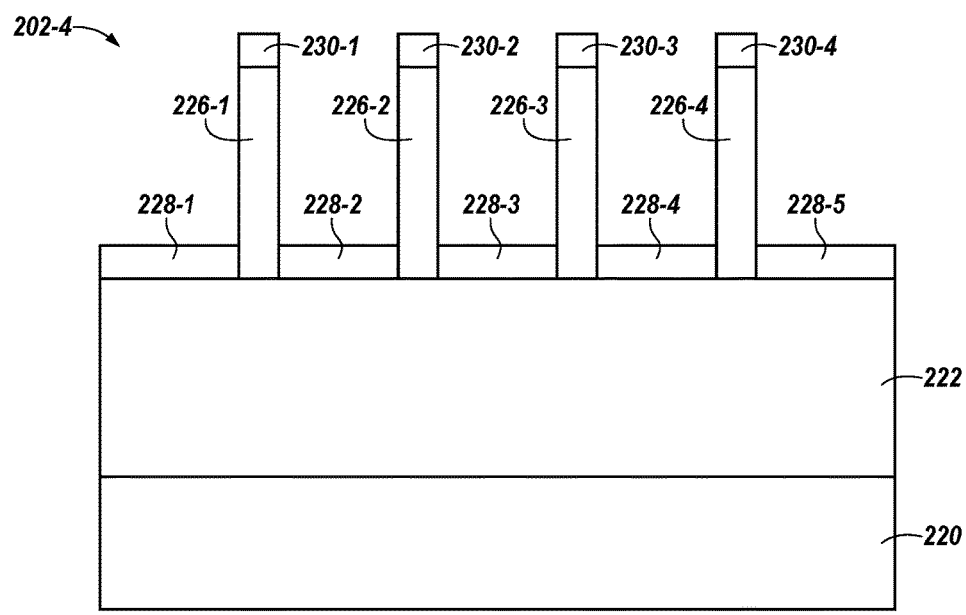

FIG. 2D is an example of a diagram 202-4 of semiconductor pitch patterning in accordance with a number of embodiments of the present disclosure. The diagram 202-4 can include a base substrate 220, a substrate 222, and a set of spacers 226 (e.g., 226-1, 226-2, 226-3, 226-4). A mask material 228-1, 228-2, 228-3, 228-4, and 228-5, hereinafter referred to as mask material 228, can be applied to a surface of the substrate 222 and a mask material 230-1, 230-2, 230-3, 230-4, hereinafter referred to as mask material 230, can be applied to a top surface (e.g., 225 in FIG. 2B) of the set of spacers 226. In at least one example, the mask materials 228, 230 can be comprised of a TiN (titanium nitride) composition.

A directional deposition of the mask materials 228 and 230 can be used to deposit the mask materials 228 and 230 to the surface of the substrate 222 and the top portions of the set of spacers 226. The mask materials 228 and 230 can be an oxide material that is used to mask the top portions of the set of spacers 226 so that a subsequent set of spacers (e.g., set of spacers 232-1, 232-2, 232-3, 232-4, 232-5, 232-6, 232-7, 232-8 in FIG. 2E) can be applied to sides of the set of spacers 226.

Directional deposition can refer to forming (e.g., depositing) a material with a direction of incidence such that surfaces that are perpendicular to the direction of deposition occurring (e.g., top portions of the set of spacers 226 would be perpendicular to the deposition of the mask material 228, 230) would have the mask material applied to it. The directional deposition can be accomplished using a physical or chemical modification. Surfaces that are parallel to the direction of the deposition (e.g., side portions of the set of spacers 226) would not have a mask material deposited onto them. An example method of directional deposition can include using a gas cluster ion beam (GCIB) to deposit the mask material 228, 230. An example method of directional deposition can include using a highly directional sputter deposition to deposit the mask material 228, 230. In at least one example, a method of direction bombardment of ions (Ar, O, N, Xe, C, etc.) can be used to modify the top surfaces of the substrate 222 and the set of spacers 226.

Figure 2E:
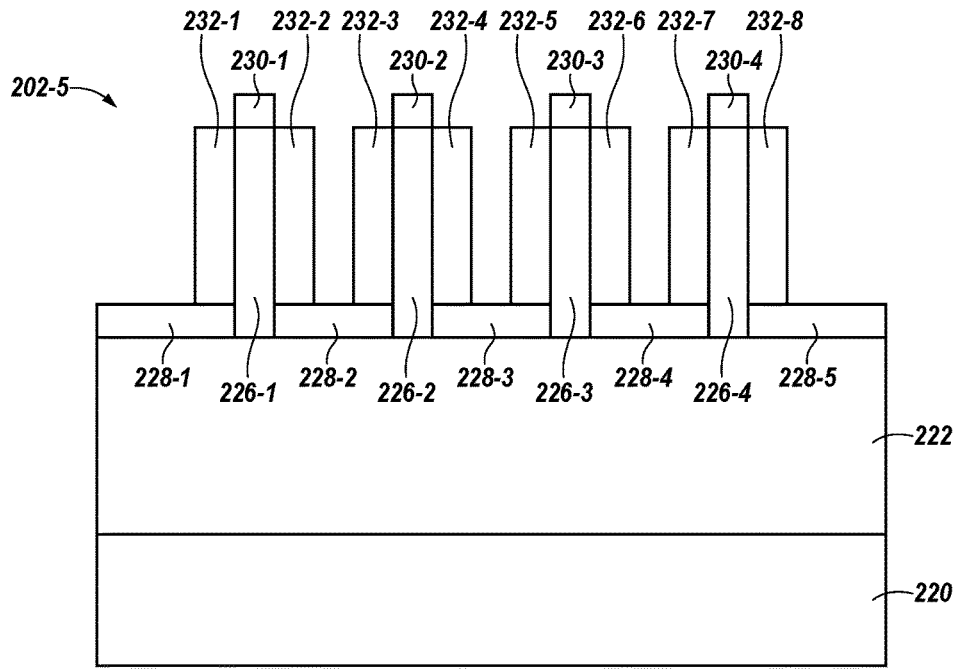

FIG. 2E is an example of a diagram 202-5 of semiconductor pitch patterning in accordance with a number of embodiments of the present disclosure. The diagram 202-5 can include a base substrate 220, a substrate 222, a set of spacers (e.g., a first set of spacers) 226, and mask material 228, 230 (as was described in FIG. 2D). A second set of spacers 232-1, 232-2, 232-3, 232-4, 232-5, 232-6, 232-7, 232-8, hereinafter referred to as second set of spacers 232, can be deposited on a side surface (e.g., side surfaces 227 illustrated in FIG. 2C) of the first set of spacers 226 using a selective deposition.

In at least one example, the second set of spacers 232 can be comprised of nitride 228, 230 and the mask material can be comprised of oxide. The selective deposition can deposit only on the side surfaces (e.g., 227) and not on the mask material 228, 230. Therefore, the second set of spacers 232 can be deposited vertically on the side surfaces of the first set of spacers 226, as illustrated in FIG. 2E.

Figure 2F:
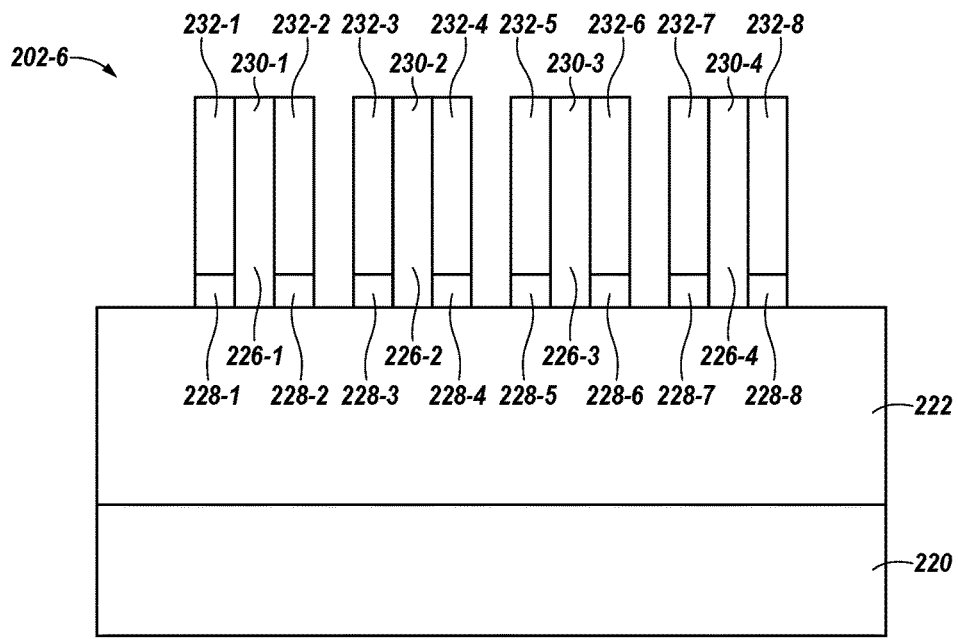

FIG. 2F is an example of a diagram 202-6 of semiconductor pitch patterning in accordance with a number of embodiments of the present disclosure. The diagram 202-6 in FIG. 2F is associated with removing portions of the mask material 228 and the mask material 230. The portions of the mask material 228 that are removed include portions that were not covered by the second set of spacers 232. For example, mask material 228-1 underneath the spacer 232-1 remains as it is covered by spacer 232-2, and so forth for mask material 228-2, 228-2, and 228-3. The horizontal portions of mask material 228 not underneath a spacer will be removed. The mask material 230 on the top surfaces of the first set of spacers 226 are removed as their use of directing the deposition of the second set of spacers 232 has been completed.

Figure 2G:
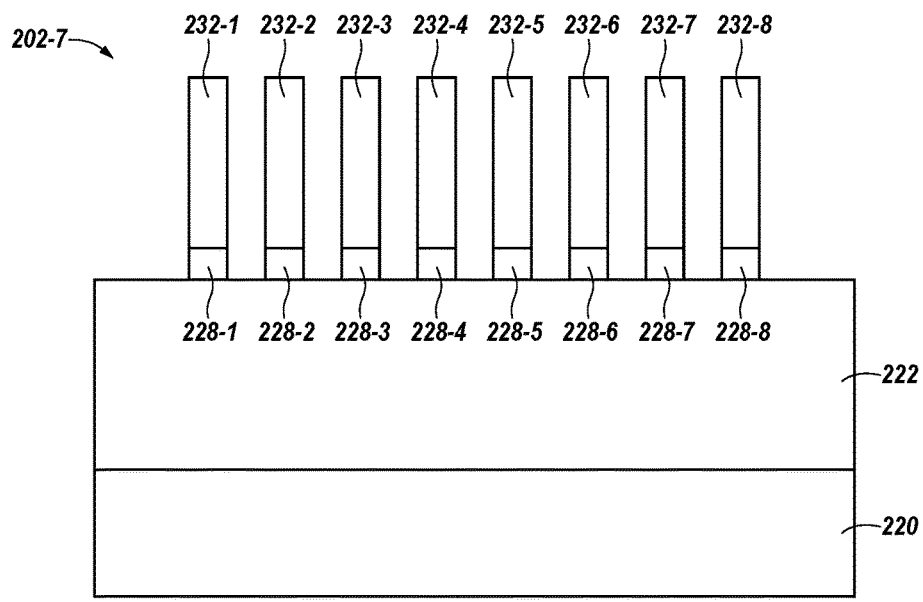

FIG. 2G is an example of a diagram 202-7 of semiconductor pitch patterning in accordance with a number of embodiments of the present disclosure. FIG. 2G illustrates the removal of the first set of spacers (e.g., second set of spacers 226 illustrated in FIG. 2F). The removal of the first set of spacers exposes the second set of spacers 232. The mask material 228 underneath the second set of spacers 232 remains as the removal of the mask material in association with FIG. 2F did not remove those portions underneath spacers. As illustrated in FIG. 2G, there are now eight (8) spacers shown when the process began with two photo resist lines (e.g., lines 224-1, 224-1 in FIG. 2A). The first set of spacers (e.g., spacers 226) included four (4) spacers. Therefore, the quantity of the second set of spacers 232 is double the quantity of the first set of spacers and quadruple the quantity of the number of lines originally used to begin the semiconductor pitch patterning process.

Figure 2H:
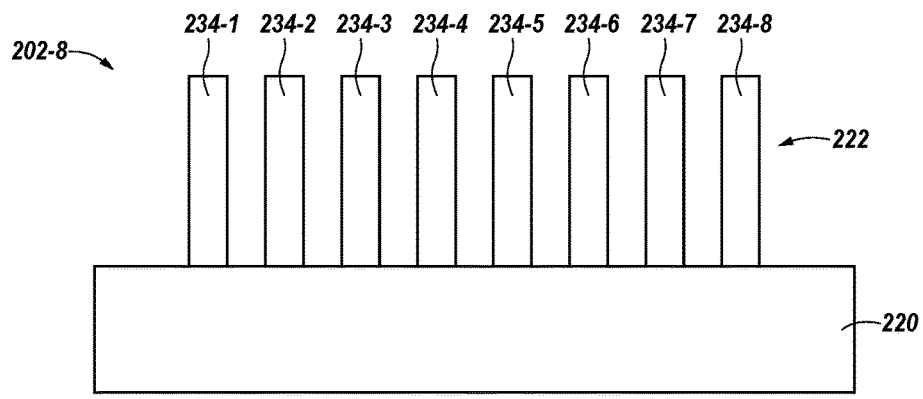

FIG. 2H is an example of a diagram 202-8 of semiconductor pitch patterning in accordance with a number of embodiments of the present disclosure. FIG. 2H is associated with a completion step of the semiconductor pitch patterning process. The second set of spacers 232 can be transferred to a substrate 222 to transfer a pitch dimension to the substrate for performing processes using the integrated circuit. The second set of spacers 232 can be transferred to the substrate 222 using an etching process or any number of transfer methods.

The semiconductor pitch patterning process demonstrates a doubling of the spacers without using hard mask layers (e.g., carbon mask layers) to transfer spacers at each quantity increasing step. For example, to go from 4 spacers (e.g., the first set of spacers) to 8 spacers (e.g., the second set of spacers), no hard mask was used. The combination of directional deposition of a mask material and selective deposition of the second set of spacers allows the process to be performed without the additional costly and time-consuming steps of etching and transferring spacer patterns to an additional hard mask. In this way, fewer steps to perform the semiconductor pitch patterning can be used in contrast to previous approaches. Further, a top portion of the spacers can be maintained to be horizontally flat with respect to the substrate using the directional deposition of the mask material and the selective deposition of the second set of spacers.

Figure 3:
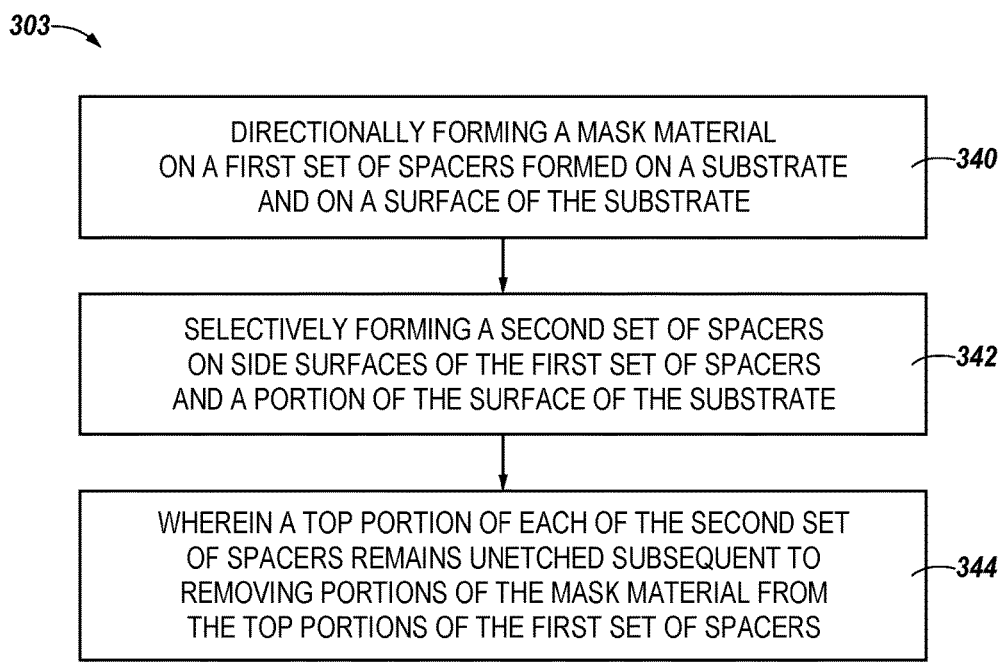
FIG. 3 is an example of a method for semiconductor pitch patterning in accordance with a number of embodiments of the present disclosure.

FIG. 3 is an example of a method 303 for semiconductor pitch patterning in accordance with a number of embodiments of the present disclosure. The method 303 can include, at 340, directionally forming a mask material on a first set of spacers formed on a substrate and on a surface of the substrate. The mask material can be directionally formed by depositing the mask material in a particular direction with regard to the substrate that the first set of spacers are positioned on and with regard to a direction that the spacers are positioned. As an example, the mask material can be applied in a direction parallel to a direction that the spacer is positioned (e.g., first set of spacers 226 positioned in a vertical direction, as illustrated in FIGS. 2B-2C). The mask material can be applied in a direction that is perpendicular to a direction of the surface of the substrate (e.g., the direction of the surface of the substrate 222) is horizontal, as illustrated in FIGS. 2B-2C).

The first set of spacers can be formed using a photo resist pattern process whereby lines associated with the photo resist pattern are deposited on the substrate. The first set of spacers are deposited on sides of the lines, thereby resulting in a quantity of the first set of spacers being twice a quantity of the lines.

The method 303 can include, at 342, selectively forming a second set of spacers on side surfaces of the first set of spacers and a portion of the surface of the substrate. Selectively depositing the second set of spacers can refer to depositing the spacers on the first set of spacers and not on the mask material. As the top surface (that is horizontal) of the first set of spacers is covered by the mask material, the second set of spacers are not deposited on a top surface of the first set of spacers. Instead, the second set of spacers are deposited along horizontal sides of the first set of spacers.

The method 303 can include, at 344, having a top portion of each of the second set of spacers remaining unetched subsequent to removing portions of the mask material from the top portions of the first set of spacers. Further, the top portions of the second set of spacers can be generally flat. As an example, the substrate 222 is positioned, as illustrated in FIGS. 2E-2H, such that a surface is horizontal and the top portion of each of the second set of spacers is horizontally flat with respect to that surface.

While the example described in association with FIGS. 2A-2H demonstrates directionally depositing a mask material and selectively depositing spacers at a particular point in the process, additional portions of the process can use such methods. For example, a pitch doubling process can use the mask material and directional and selective depositing methods to double the pitch. In addition, a pitch quadrupling process can use the mask material and directional and selective depositing methods either at the doubling step, at the quadrupling step, or at points in the process. The method is not limited to use at either portion of the process.

Figure 4:
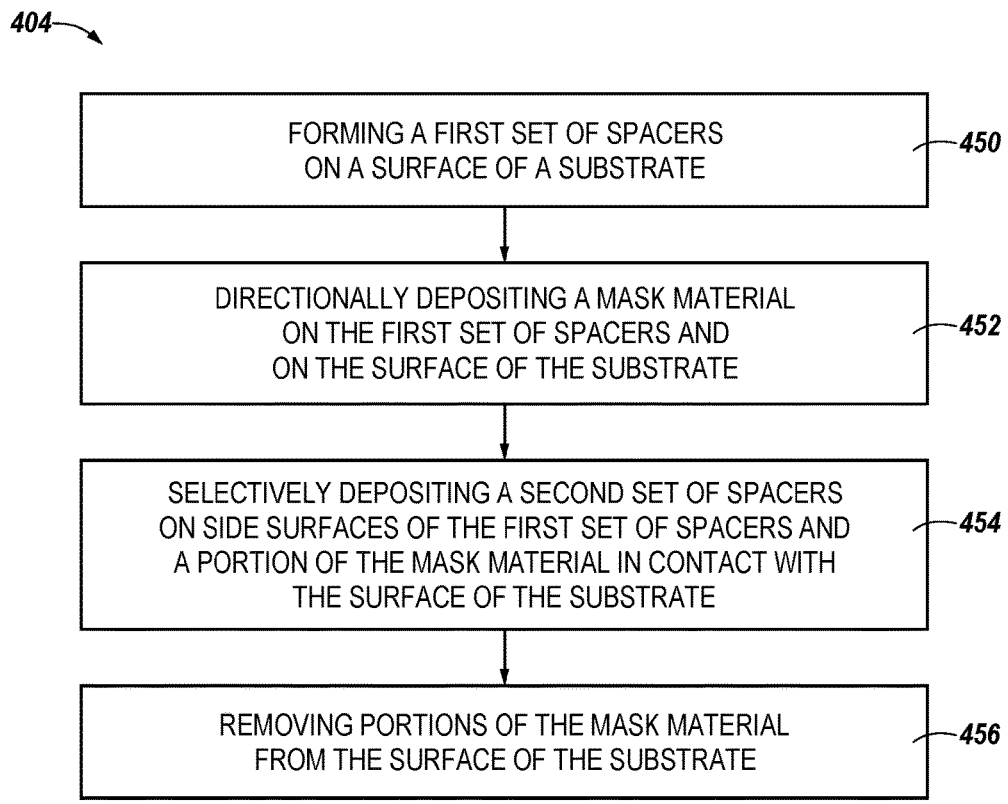
FIG. 4 is an example of a method for semiconductor pitch patterning in accordance with a number of embodiments of the present disclosure.

FIG. 4 is an example of a method 404 for semiconductor pitch patterning in accordance with a number of embodiments of the present disclosure. The method 404 can include, at 450, forming a first set of spacers on a surface of a substrate. The first set of spacers can be formed by first using a photo resist pattern process to form the first set of spacers on the substrate. The photo resist pattern can use two lines, four lines, etc. to double the spacers to four spacers, eight spacers, etc.

The method 404 can include, at 452, directionally depositing a mask material on the first set of spacers and on the surface of the substrate. The mask material can be deposited on a top surface of each of the first set of spacers. The mask material can be deposited on a horizontal portion of the substrate between the first set of spacers and between each end spacer of the first set of spacers and the outside edge of the substrate. In this way, only the side portions of the first set of spacers are not covered by the mask material and subsequent layer patterning can occur there.

The method 404 can include, at 454, selectively depositing a second set of spacers on side surfaces of the first set of spacers and a portion of the mask material in contact with the surface of the substrate. For example, the second set of spacers can be formed on the sides of the first set of spacers that did not get covered by the mask material. A bottom surface of the second set of spacers can be deposited on a portion of the mask material that was deposited in a corner defined as where the bottom side edges of the first set of spacers meet the substrate.

The method 404 can include, at 456, removing portions of the mask material from the surface of the substrate. The portion of the mask material not removed is the portion of the mask material that the second set of spacers was deposited on top of (mentioned as being deposited where the bottom side edges of the first set of spacers meet the substrate). The mask material applied to a top surface of each of the first set of spacers can also be removed.

The method 404 can include removing the first set of spacers. The removal of the first set of spacers exposes the second set of spacers and provides for a particular pitch patterning and/or dimension on the substrate. Subsequent to the removal of the first set of spacers, the particular layout of the second set of spacers can be transferred to the substrate so that the substrate includes the particular layout. This pitch patterning layout can be positioned on top of a base substrate and can be used by an integrated circuit in performing operations.

Figure 5:
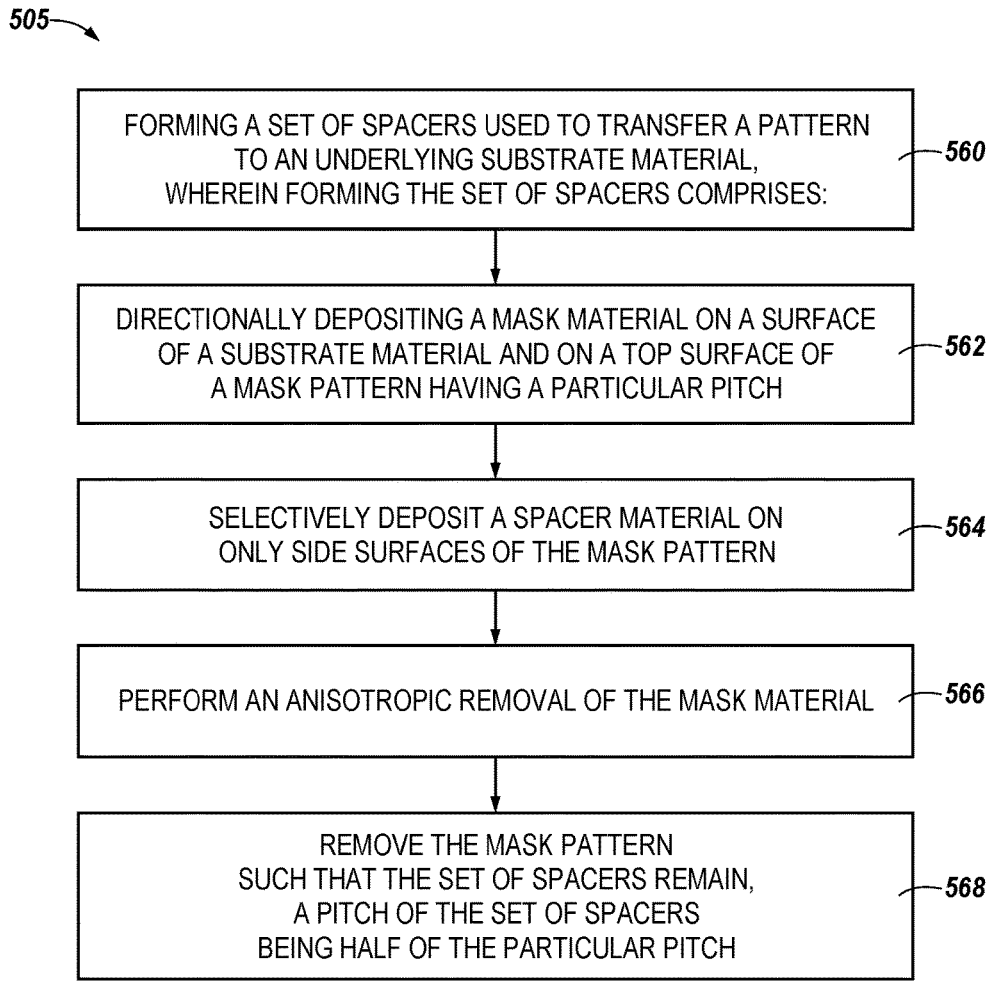
FIG. 5 is an example of a method for semiconductor pitch patterning in accordance with a number of embodiments of the present disclosure.

FIG. 5 is an example of a method 505 for semiconductor pitch patterning in accordance with a number of embodiments of the present disclosure. The method 505 can include, at 560, forming a set of spacers used to transfer a pattern to an underlying substrate material. Forming the set of spacers can include, at 562, directionally depositing a mask material on a surface of a substrate material and on a top surface of a mask pattern having a particular pitch. Forming the set of spacers can include, at 564, selectively depositing a spacer material on only side surfaces of the mask pattern. Forming the set of spacers can include, at 566, performing an anisotropic removal of the mask material. Forming the set of spacers can include, at 568, removing the mask pattern such that the set of spacers remain, a pitch of the set of spacers being half of the particular pitch.

The method 505 can include not removing any spacer material when performing the anisotropic removal of the mask material. The set of spacers can be a second set of spacers, and the mask pattern can include a first set of spacers formed of a spacer material. The first set of spacers can be formed without performing a dry etch on the spacer material. The second set of spacers can comprise silicon nitride. The first set of spacers can comprise silicon nitride. The mask material can comprise titanium nitride.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one.

Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for semiconductor pitch patterning, comprising:
    directionally forming a mask material on:
        a first set of spacers formed on a substrate; and
        a surface of the substrate;
    selectively forming a second set of spacers on side surfaces of the first set of spacers and a portion of the surface of the substrate;
    removing portions of the mask material from top portions of the first set of spacers;
    wherein a top portion of each of the second set remains unetched subsequent to removing portions of the mask material from the top portions of the first set of spacers; and
    applying an additional directional deposition of an additional mask material on the second set of spacers and the surface of the substrate.

2. The method of claim 1, further comprising removing portions of the mask material from the surface of the substrate.

3. The method of claim 2, further comprising removing the first set of spacers.

4. The method of claim 1, wherein the first set of spacers are formed on the substrate by:
    forming a photo resist material on the substrate;
    forming the first set of spacers on side surfaces of the photo resist material.

5. The method of claim 4, further comprising removing the photo resist material.

6. The method of claim 1, further comprising directionally depositing the mask material via a gas cluster ion beam method.

7. The method of claim 1, comprising selectively depositing a third set of spacers on side surfaces of the second set of spacers.

8. The method of claim 7, comprising removing the additional mask material from a top of the second set of spacers and the surface of the substrate.

9. The method of claim 8, comprising removing the second set of spacers.

10. The method of claim 9, wherein a quantity of the third set of spacers is four times a quantity of the first set of spacers.

* * * * *